United States Patent
Kitada et al.

(10) Patent No.: US 7,713,869 B2
(45) Date of Patent: May 11, 2010

(54) MANUFACTURE METHOD FOR SEMICONDUCTOR DEVICE SUITABLE FOR FORMING WIRINGS BY DAMASCENE METHOD AND SEMICONDUCTOR DEVICE

(75) Inventors: Hideki Kitada, Kawasaki (JP);
Nobuyuki Ohtsuka, Kawasaki (JP);
Noriyoshi Shimizu, Kawasaki (JP);
Yoshiyuki Nakao, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/289,512

(22) Filed: Nov. 30, 2005

(65) Prior Publication Data

US 2007/0045851 A1      Mar. 1, 2007

(30) Foreign Application Priority Data

Aug. 30, 2005 (JP) ............................. 2005-248554
Oct. 12, 2005 (JP) ............................. 2005-297955

(51) Int. Cl.
*H01L 21/44* (2006.01)
(52) U.S. Cl. ...................................... 438/658; 438/660
(58) Field of Classification Search ......... 257/E21.593, 257/E21.579; 438/657, 658
See application file for complete search history.

(56) References Cited

U.S. PATENT DOCUMENTS

| | | | |
|---|---|---|---|
| 6,242,750 B1* | 6/2001 | Takahashi et al. ....... | 250/492.21 |
| 6,277,745 B1* | 8/2001 | Liu et al. ..................... | 438/687 |
| 6,331,732 B1* | 12/2001 | Gupta et al. ................. | 257/752 |
| 2003/0042610 A1* | 3/2003 | Kitada et al. ................ | 257/758 |
| 2004/0092096 A1* | 5/2004 | Raaijmakers et al. ....... | 438/627 |
| 2005/0006776 A1 | 1/2005 | Lin et al. | |
| 2005/0250321 A1* | 11/2005 | Hwang ....................... | 438/672 |
| 2005/0277298 A1* | 12/2005 | Lin et al. .................... | 438/687 |
| 2006/0128148 A1* | 6/2006 | Takahashi ................... | 438/661 |
| 2006/0189115 A1* | 8/2006 | Sakai et al. ................. | 438/603 |

OTHER PUBLICATIONS

Koike, J. "Self-forming diffusion layer in Cu-Mn alloy metallization" Applied Physics Letters 87, published Jul. 22, 2005 pp. 041911-1 through 041911-3.*

(Continued)

*Primary Examiner*—N Drew Richards
*Assistant Examiner*—Grant S Withers
(74) *Attorney, Agent, or Firm*—Westerman, Hattori, Daniels & Adrian, LLP

(57) ABSTRACT

An interlayer insulating film having a concave portion is formed on a semiconductor substrate. A tight adhesion film is formed on the inner surface of the concave portion and the upper surface of the insulating film. The surface of the adhesion layer is covered with an auxiliary film made of Cu alloy containing a first metal element. A conductive member containing a second metal element other than the first metal element is embedded in the concave portion, and deposited on the auxiliary film. Heat treatment is performed to make atoms of the first metal element in the auxiliary film segregate on the inner surface of the concave portion. The adhesion layer contains an element for enhancing tight adhesion of the auxiliary film more than if the auxiliary film is deposited directly on a surface of the interlayer insulating film. During the period until the barrier layer having also the function of enhancing tight adhesion, it becomes possible to retain sufficient tight adhesion of a wiring member and prevent peel-off of the wiring member.

5 Claims, 8 Drawing Sheets

OTHER PUBLICATIONS

Office Action dated Apr. 14, 2009, issued in Japanese Application No. 2005-297955.

W.A. Lanford et al., "Low-temperature passivation of copper by doping with Al or Mg", Thin Solid Films, 262(1995) p. 234-241.

T. Usui et al., "Low Resistive and Highly Reliable Cu Dual-Damascene Interconnect Technology Using Self-Formed MnSixOy Barrier Layer", IITC 2005, Session 9.2.

* cited by examiner

MANUFACTURE METHOD FOR SEMICONDUCTOR DEVICE SUITABLE FOR FORMING WIRINGS BY DAMASCENE METHOD AND SEMICONDUCTOR DEVICE

CROSS REFERENCE TO RELATED APPLICATION

This application is based on and claims priority of Japanese Patent Application No. 2005-297955 filed on Oct. 12, 2005, the entire contents of which are incorporated herein by reference.

BACKGROUND OF THE INVENTION

A) Field of the Invention

The present invention relates to a semiconductor device manufacture method and a semiconductor device, and more particularly to a semiconductor device manufacture method suitable for forming wirings by filling concave portions formed in an interlayer insulating film with conductor and a semiconductor device.

B) Description of the Related Art

Miniaturization of wirings and increasing of wiring layers are progressing as semiconductor elements are highly integrated and chip sizes are reduced. In a logical element having a multi-layer wiring structure, a delay of a signal transmitting along a wiring is becoming a dominant factor of lowering an operation speed of the logical element. The delay of a signal transmitting along a wiring is proportional to a product of a wiring resistance and a parasitic capacitance between wirings.

Technologies of using copper (Cu) having a low resistivity as wiring material are adopted practically in order to reduce wiring resistance. Since it is difficult to pattern a copper film by using photolithography process, a damascene method is generally adopted to form copper wirings.

When a copper wiring is formed by the damascene method, the inner surface of a wiring trench and a via hole is covered with a barrier layer before the copper film is deposited, the main object of the barrier layer being to prevent diffusion of copper into an insulating film. Refractory metal such as tantalum (Ta) and tungsten (W) is used as the material of a barrier film. Refractory metal has a resistivity higher than that of copper.

As the size of a wiring becomes fine, a ratio of the barrier layer occupying the cross section of the wiring becomes large. Therefore, the barrier layer has a large factor of raising a wiring resistance. Especially, in a fine multi-layer wiring structure having a diameter and wiring width of a via hole of 0.1 µm or smaller, it is desired to make the barrier layer as thin as possible.

Chemical vapor deposition (CVD), atomic layer deposition (ALD) and the like are considered hopeful as techniques of forming a thin barrier layer. If these film forming methods are adopted by using low dielectric constant material as the material of an interlayer insulating film, a sufficient tight adhesion cannot be obtained.

The document "Low-temperature passivation of copper by doping with Al or Mg" by W. A. Lanford et al., Thin Solid Films, 262(1995), pp. 234 to 241 discloses the technique of forming an Al oxide or Mg oxide layer on the surface of Cu by doping Al or Mg into Cu and performing heat treatment. This oxide layer functions as a protective film and diffusion preventing film for Cu.

Next, description will be made on a method of forming a thin barrier layer having a uniform thickness, disclosed in the document "Low Resistive and Highly Reliable Cu Dual-Damascene Interconnect Technology Using Self-Formed $MnSi_xO_y$ Barrier layer" by T. Usui et al., IITC 2005, Session 9.2. A seed layer of CuMn alloy is formed by sputtering on the surface of an interlayer insulating film formed with wiring trenches and via holes. Thereafter, copper is electroplated to fill the wiring trench and via hole with the copper. Heat treatment is performed to react Si and O as the constituent elements in the interlayer insulating film with Mn as the constituent element in the seed layer. A barrier layer is therefore formed at the interface between a Cu wiring and the interlayer insulating film, the barrier layer being made of $MnSi_xO_y$ compound which is very thin about 2 to 3 nm in thickness and has a uniform thickness. This barrier layer prevents diffusion of Cu.

The seed layer covering the bottom of the via hole does not contact the interlayer insulating film and contacts a lower level wiring. Therefore, the barrier layer is not formed at the interface between the copper wiring in the via hole and the lower level wiring, so that the upper and lower level wirings can be connected without the barrier layer between the upper and lower level wirings. Further, since the barrier layer made of MnSiO compound can be made thinner than a barrier layer made of refractory metal, it is possible to suppress an increase of wiring resistance.

SUMMARY OF THE INVENTION

In a conventional method of forming a barrier layer made of MnSiO compound at an interface between a copper wiring and an interlayer insulating film, the barrier layer has also a function of enhancing tight adhesion of the copper wiring. The barrier layer made of MnSiO compound is not formed during the period after the seed layer of CuMn alloy is formed and before heat treatment is executed. The present inventors have found that sufficient tight adhesion is not obtained between the seed layer and interlayer insulating film in such a state where the barrier layer is not formed. More specifically, a copper wiring may be peeled off after copper is electroplated and before heat treatment is executed.

Tight adhesion was evaluated by forming 25 samples which have CuMn alloy layers having a thickness of 90 nm formed on a surface of each of silicon oxide films, porous methylsilsesquioxane (porous MSQ) films, SiCN films and SiOC films. Tape tests were conducted and peel-off arose in all samples. Tape tests were conducted after heat treatment for one minute at 300° C. in a nitrogen atmosphere, and peel-off did not arise in any samples. This may be ascribed to improved tight adhesion because heat treatment forms a barrier layer of MnSiO compound. It can be understood from this that the state before heat treatment does not retain sufficient tight adhesion.

It is expected that a copper wiring can be prevented from being peeled off, if heat treatment is executed to form a barrier layer of MnSiO compound before copper electroplating is performed. However, when heat treatment is executed before copper electroplating, the seed layer of CuMn alloy is aggregated and it becomes difficult to fill a wiring trench and a via hole with copper at good reproductivity.

An object of the present invention is to provide a semiconductor device manufacture method capable of obtaining sufficient tight adhesion of wiring material and preventing peel-off of the wiring material before a barrier layer having also a function of improving tight adhesion is formed. Another object of the present invention is to provide a semiconductor device suitable for being manufactured by this method.

According to one aspect of the present invention, there is provided a semiconductor device manufacture method comprising steps of: (a) forming an interlayer insulating film having a concave portion, on a semiconductor substrate; (b) forming a adhesion layer on an inner surface of the concave portion and on an upper surface of the interlayer insulating film; (c) covering a surface of the adhesion layer with an auxiliary film made of Cu alloy containing a first metal element; (d) embedding a conductive member containing a second metal element other than the first metal element, in the concave portion, and depositing the conductive member on the auxiliary film; and (e) performing heat treatment to make atoms of the first metal element in the auxiliary film segregate on the inner surface of the concave portion, wherein the adhesion layer contains an element for enhancing tight adhesion of the auxiliary film more than if the auxiliary film is deposited directly on a surface of the interlayer insulating film.

According to another aspect of the present invention, there is provided a semiconductor device comprising: an interlayer insulating film formed on a semiconductor substrate; a concave portion formed in the interlayer insulating film; and a conductive member filling the concave portion and made of copper alloy containing a metal element other than Mn, Al, Mg, Ni and Re, wherein at least one metal element selected from a group consisting of Mn, Al, Mg, Ni and Re is segregated at an interface between the conductive member and the interlayer insulating film.

According to still another aspect of the present invention, there is provided a semiconductor device comprising: an interlayer insulating film formed on a semiconductor substrate; a concave portion formed in the interlayer insulating film; and a conductive member filling the concave portion and made of copper alloy containing a metal element other than Mn, Al, Mg, Ni and Re, wherein: at least one metal element selected from a group consisting of Mn, Al, Mg, Ni and Re is segregated at an interface between the conductive member and the interlayer insulating film; and a concentration of at least one element contained in the interlayer insulating film and selected from a group consisting of S, N, P, C, Si, O and B is higher at a portion contacting an inner surface of the concave portion than a concentration in a region remote from the inner surface.

Since the adhesion layer is formed at the step (b) before atoms of the first metal element are segregated on the inner surface of the concave portion, it is possible to retain sufficient tight adhesion of the auxiliary film and conductive member.

Atoms of the first metal element are segregated at the interface between the conductive member and interlayer insulating film. A reaction substance layer obtained through reaction between the segregated atoms and elements in the interlayer insulating film functions as the adhesion layer and diffusion preventing layer.

DESCRIPTION OF THE PREFERRED EMBODIMENTS

Figure 1:
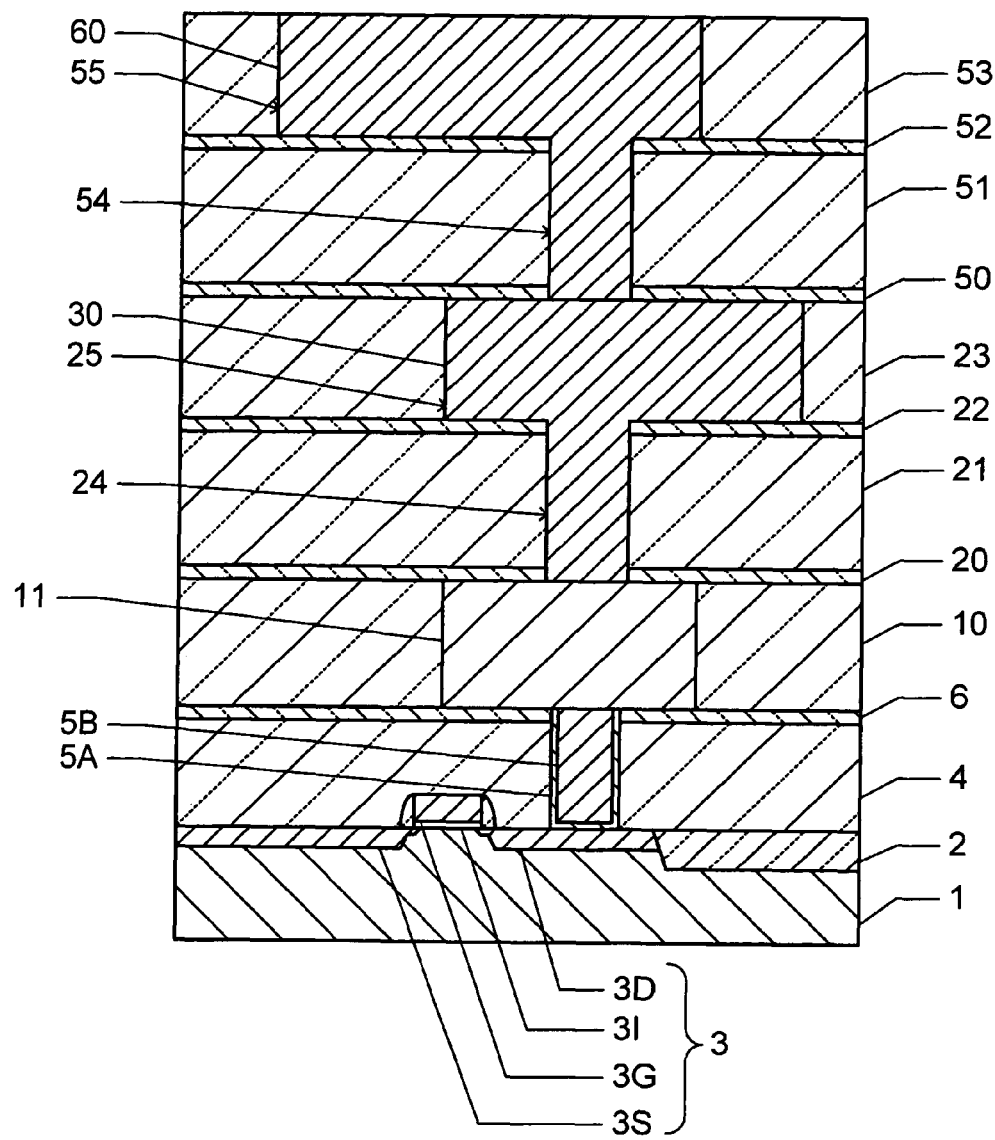
FIG. 1 is a schematic cross sectional view of a semiconductor device according to an embodiment.

FIG. 1 is a schematic cross sectional view of a semiconductor device manufactured by the embodiment method. An element isolation insulating film 2 of a shallow trench isolation (STI) structure is formed in a surface layer of a semiconductor substrate 1 of silicon, to define active regions. A MOS transistor 3 is formed in an active region. The MOS transistor 3 is constituted of a source region 3S, a drain region 3D, a gate insulating film 31 and a gate electrode 3G.

An interlayer insulating film 4 of silicon oxide having a thickness of 300 nm and a protective film 6 of SiOC having a thickness of 50 nm are formed on the semiconductor substrate 1, covering the MOS transistor 3. A via hole is formed through the protective film 6 and interlayer insulating film 4, and a partial surface of the drain region 3D is exposed on the bottom of the via hole. A conductive plug 5B of tungsten (W) is embedded in the via hole. A barrier metal layer 5A of TiN having a thickness of 25 nm is disposed between the conductive plug 5B and the inner surface of the via hole.

The structure described above can be formed by well-known photolithography, etching, chemical vapor deposition (CVD), chemical mechanical polishing (CMP) and the like.

An interlayer insulating film 10 made of low dielectric constant insulating material is formed on the protective film 6. A wiring trench is formed in the interlayer insulating film 10, reaching the bottom of the film 10 and passing over the conductive plug 5B. A first layer copper wiring 11 is embedded in the wiring trench. The copper wiring 11 is connected to the conductive plug 5B.

A cap film 20, a via interlayer insulating film 21, an etching stopper film 22 and a wiring interlayer insulating film 23 are formed on the interlayer insulating film 10 in the order recited.

A wiring trench 25 is formed in the wiring interlayer insulating film 23, and a via hole 24 is formed in the via interlayer insulating film 21. The wiring trench 25 reaches the upper surface of the etching stopper film 22. The via hole 24 opens on the bottom of the wiring trench 25 and reaches the upper surface of the lower level wiring 11 through the cap film 20.

A conductive member 30 of copper or copper alloy is embedded in the wiring trench 25 and via hole 24. The conductive member 30 is connected to the first layer wiring 11 to constitute a second layer wiring. The detailed structure including the barrier layer will be later described in each of the embodiments.

A cap film 50, a via interlayer insulating film 51, an etching stopper film 52 and a wiring interlayer insulating film 53 are stacked on the wiring interlayer insulating film 23. Similar to the second level wiring structure, a wiring trench 55 and a via hole 54 are formed and a conductive member 60 is embedded therein. The conductive member 60 constitutes a third layer wiring.

With reference to FIGS. 2A to 2F, description will be made on a method of forming the second layer wiring structure from the cap film 20 to the interlayer insulating film 23. The second layer wiring structure is formed by a dual damascene method. The third layer wiring structure is formed by the same method as that used for the second layer wiring structure. The first layer wiring 11 is formed by a single damascene method different from the dual damascene method, but a barrier layer forming method, a method of depositing a conductive member in the wiring trench and other methods are the same as those adopted by the method of forming the second layer wiring structure.

Figure 2A:
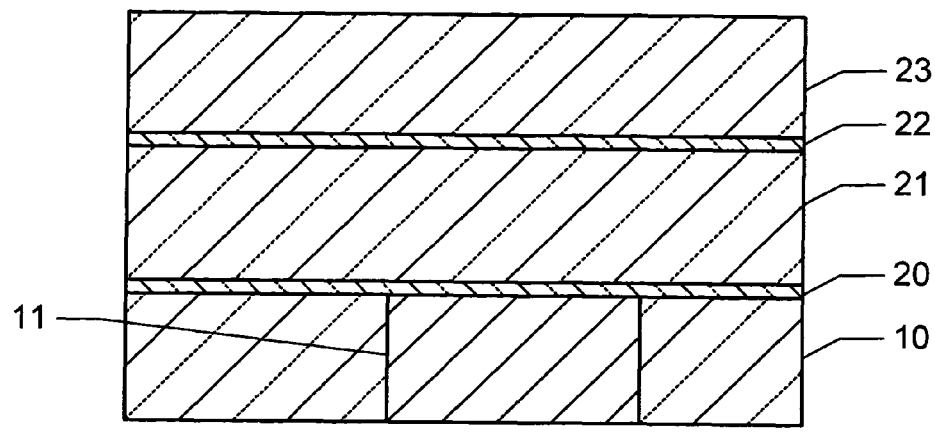
FIGS. 2A to 2F are cross sectional views of a semiconductor device during manufacture illustrating a semiconductor device manufacture method according to a first embodiment.

As shown in FIG. 2A, a cap film 20, a via interlayer insulating film 21, an etching stopper film 22 and a wiring interlayer insulating film 23 are sequentially formed on an interlayer insulating 10. For example, the cap film 20 has a two-layer structure of a silicon oxide (SiO) film and a silicon carbide (SiC) film, and has a total thickness of 20 to 70 nm. For example, the etching stopper film 22 is made of SiC or silicon nitride (SiN) and has a thickness of 20 to 70 nm. These films can be formed by CVD.

The interlayer insulating films 21 and 23 are made of organic or inorganic low dielectric constant insulating material and have a thickness of 300 to 700 nm. The inorganic low dielectric constant insulating material may be porous silica or SiOC. The organic low dielectric constant insulating material may be SiLK® manufactured by the Dow Chemical Company. These materials contain Si and O as the constituent elements.

Figure 2B:
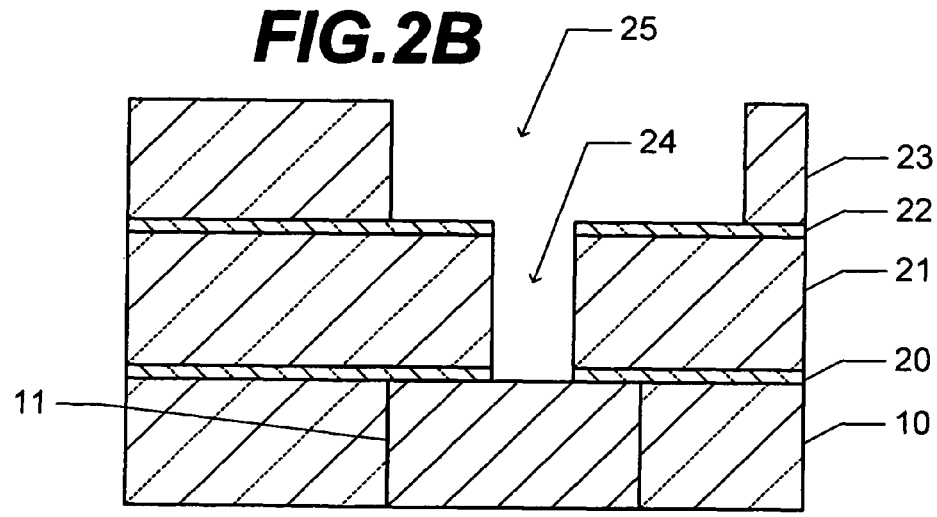

As shown in FIG. 2B, a wiring trench 25 is formed through the wiring interlayer insulating film 23, and a via hole 24 is formed through the via interlayer insulating film 21. For example, the size of the via hole 24 in a plan cross section is 0.06 to 0.1 μm and a minimum width of the wiring trench 25 is 0.06 μm. The wiring trench 25 and via hole 24 can be formed by dry etching using CF-containing etching gas and by using a hard mask constituted of, for example, two layers of an SiO film and an SiC film. The wiring trench 25 reaches the upper surface of the etching stopper film 22, and the via hole 24 reaches the upper surface of the first layer wiring 11.

Figure 2C:
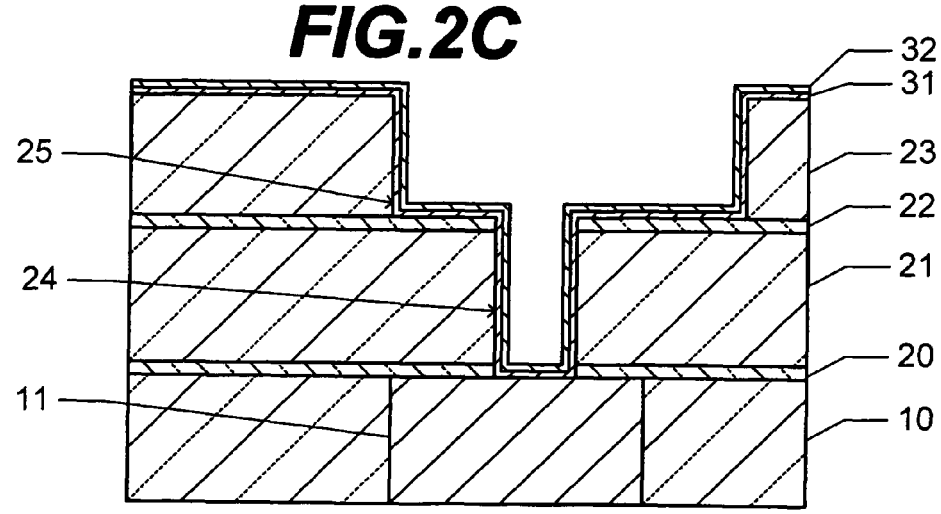

As shown in FIG. 2C, an adhesion layer 31 made of silver (Ag) is formed by sputtering, covering the upper surface of the wiring interlayer insulating film 23, the inner surface of the wiring trench 25 and the inner surface of the via hole 24. A thickness of the adhesion layer 31 is sufficient if the adhesion layer can cover the exposed surface wholly. It is not necessary to make the adhesion layer 31 thicker than necessary. Specifically, a thickness of the adhesion layer 31 is preferably set to 2 to 10 nm. The adhesion layer 31 may be deposited by CVD or ALD.

On the adhesion layer 31, an auxiliary film 32 of CuMn alloy is formed by sputtering. For example, CuMn alloy having a Mn content of 2 wt. % is used as the target. A thickness of the auxiliary film 32 is 40 to 80 nm, typically 60 nm. After the adhesion layer 31 is formed and before the auxiliary film 32 is formed, the adhesion layer 31 and auxiliary film 32 are formed in the same chamber or formed by a film forming system having a plurality of chambers coupled via a vacuum chamber in order to prevent the substrate from being exposed to atmospheric air. The auxiliary film 32 may be deposited by CVD or ALD.

Figure 2D:
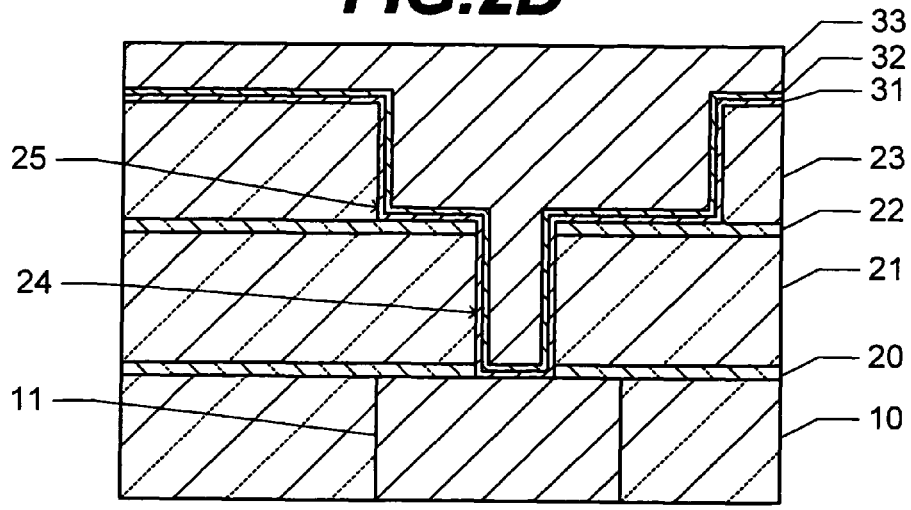

As shown in FIG. 2D, copper (Cu) is electroplated by using the auxiliary film 32 as an electrode. A thickness of copper to be electroplated is, for example, 1 μm. Therefore, a conductive member 33 of copper is deposited in the via hole 24 and wiring trench 25 and on the interlayer insulating film 23. After the conductive member 33 is deposited, annealing is performed for an annealing time of about 5 minutes at a temperature of 300 to 400° C. in an oxidizing atmosphere.

Figure 2E:
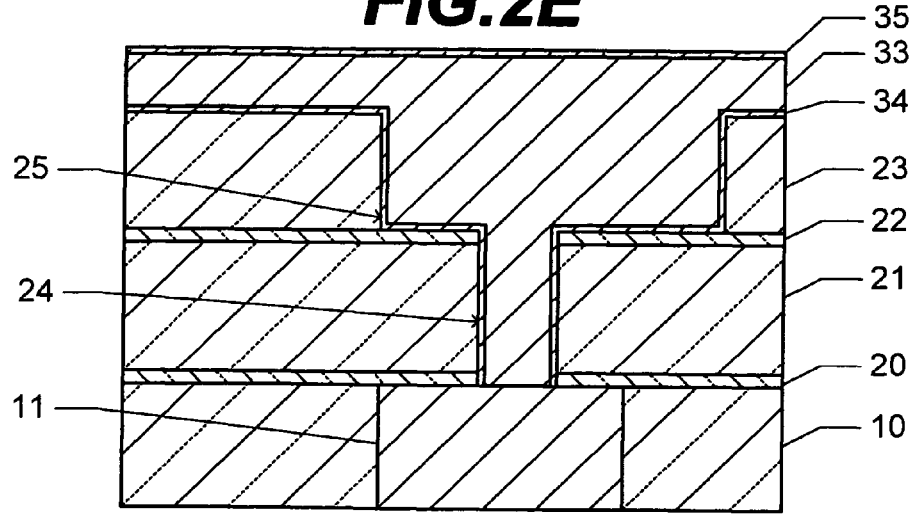

FIG. 2E shows the state after annealing. Mn atoms in the auxiliary film 32 are segregated on the inner surface of the wiring trench 25 and via hole 24. The segregated Mn reacts with Si and O constituting the interlayer insulating films 21 and 23 and etching stopper film 22, so that a barrier layer 34 of $MnSi_xO_y$ is formed. Mn atoms diffuse in the conductive member 33, reach the surface thereof and react with oxygen. Therefore, a manganese oxide 35 is formed on the conductive member 33.

Ag atoms constituting the adhesion layer 31 diffuse in the conductive member 33 and distribute generally uniformly without being segregated. Namely, the adhesion layer 31 made of Ag is extinguished. Under the conditions of this embodiment, an Ag concentration in the conductive member 33 is about 0.05 wt. %. The Ag concentration of the conductive member 33 changes with a thickness of the adhesion layer 31 and a volume of the conductive member 33.

Figure 3A:
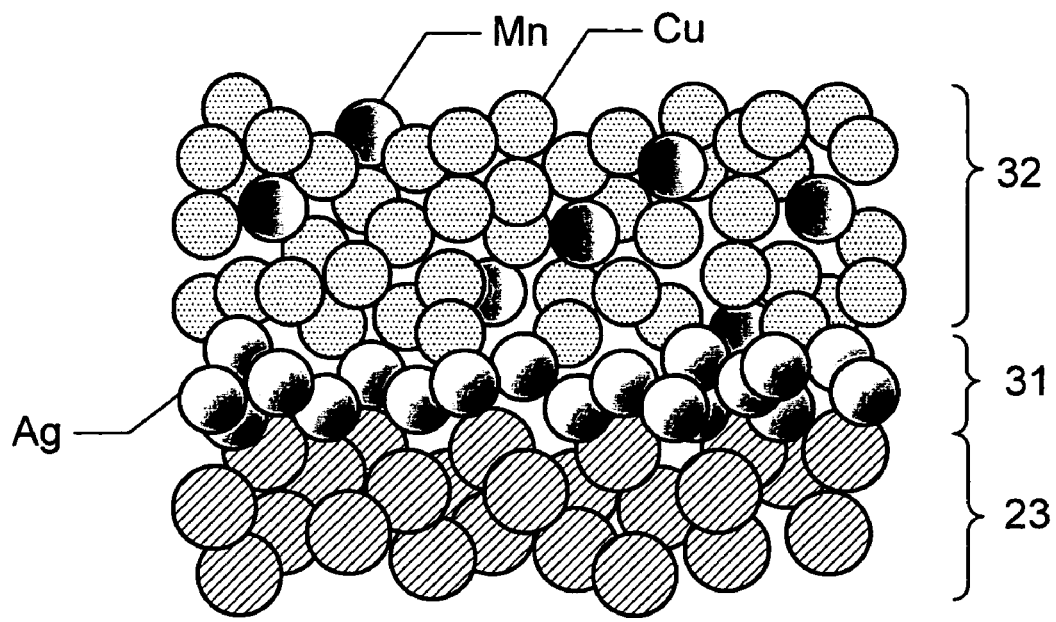
FIGS. 3A and 3B are conceptual diagrams of an interface between a conductive member and an interlayer insulating film at an atomic level, respectively before and after annealing in the semiconductor device manufacture method according to the first embodiment.
Figure 3B:
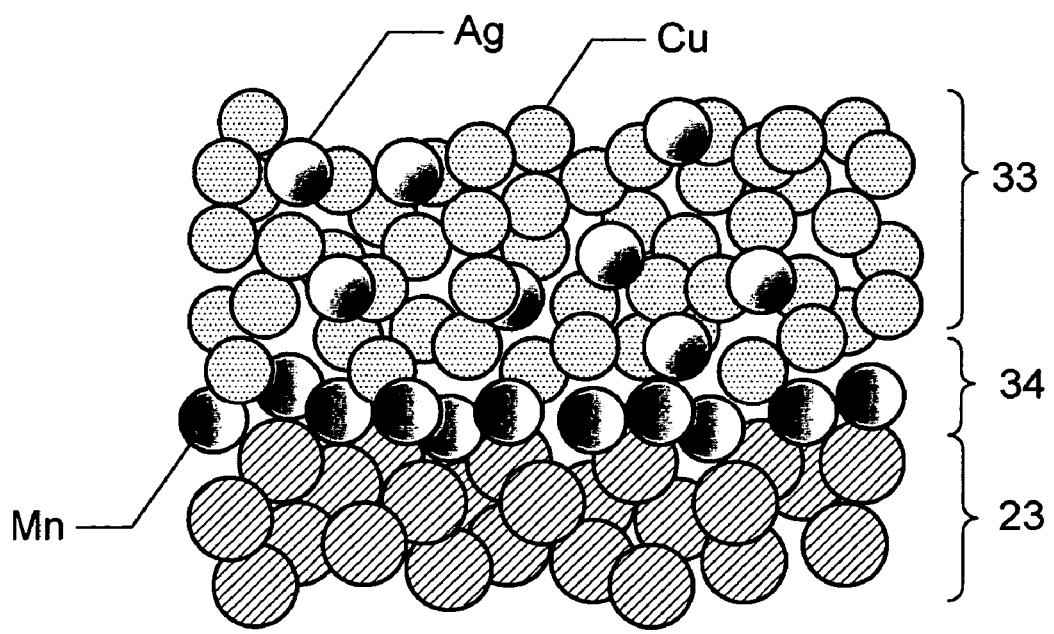

FIGS. 3A and 3B are conceptual diagrams showing an interface between the conductive member 33 and the interlayer insulating film 23 at an atomic level before and after annealing, respectively. As shown in FIG. 3A, before annealing, it is possible to clearly distinguish between the adhesion layer 31 of Ag formed on the surface of the interlayer insulating film 23 and the auxiliary film 32 of CuMn alloy. As shown in FIG. 3B, after annealing, Mn is segregated on the surface of the interlayer insulating film 23. Mn binds to Si and O in the interlayer insulating film 23 to form the barrier layer 34 of $MnSi_xO_y$.

Ag atoms distribute generally uniformly in the conductive member 33. Most of Mn atoms segregate at the interface between the conductive member 33 and interlayer insulating film 23 and on the surface of the conductive member 33.

Figure 2F:
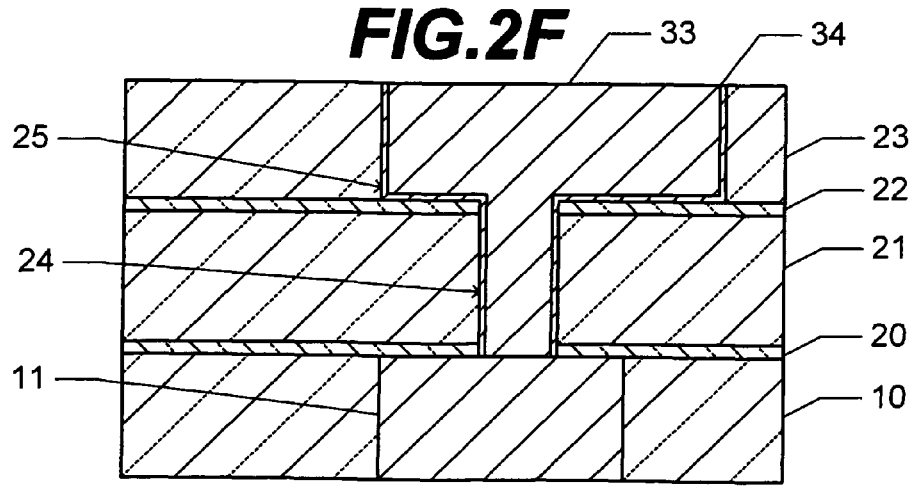

As shown in FIG. 2F, an unnecessary conductive member 33 is removed by chemical mechanical polishing (CMP). The conductive member 33 left in the wiring trench 25 and the via hole 24 constitutes the second layer wiring and functions also as an interlayer connection member between the first and second layer wirings.

In the first embodiment described above, the barrier layer 34 prevents copper diffusion and enhances tight adhesion of the conductive member 33. Before the barrier layer 34 is formed, i.e., in the state shown in FIG. 2D, the adhesion layer 31 of Ag enhances tight adhesion of the auxiliary film 32 and conductive member 33. It is therefore possible to prevent peel-off of the conductive member 33.

Tight adhesion was evaluated by actually forming: 25 samples A having a CuMn alloy film of 90 nm in thickness formed on a silicon oxide ($SiO_2$) film; 25 samples B having a CuMn alloy film of 90 nm in thickness and a silicon oxycarbide (SiOC) film; 25 samples C having an Ag film inserted between a CuMn alloy film of 90 nm in thickness and an $SiO_2$ film; and 25 samples D having an Ag film inserted between a CuMn alloy film of 90 nm in thickness and an SiOC film. Tight adhesion was evaluated by JIS crosscut tape tests ASTM3359-87. In all 25 samples A and all 25 samples B, peel-off arose, whereas in all samples C and D, peel-off did not arise. It can be understood from these evaluation results that the adhesion layer 31 of Ag has the function of enhancing tight adhesion of the auxiliary film 32.

In the first embodiment, although Ag is used as the material of the adhesion layer 31, other metals may also be used. Description will be made on metals suitable for the material of the adhesion layer 31.

Constituent elements of the adhesion layer 31 diffuse eventually in the conductive member 33. It is therefore preferable to use, as the material of the adhesion layer 31, metal maintaining a low resistivity even after forming alloy with Cu.

Figure 4:
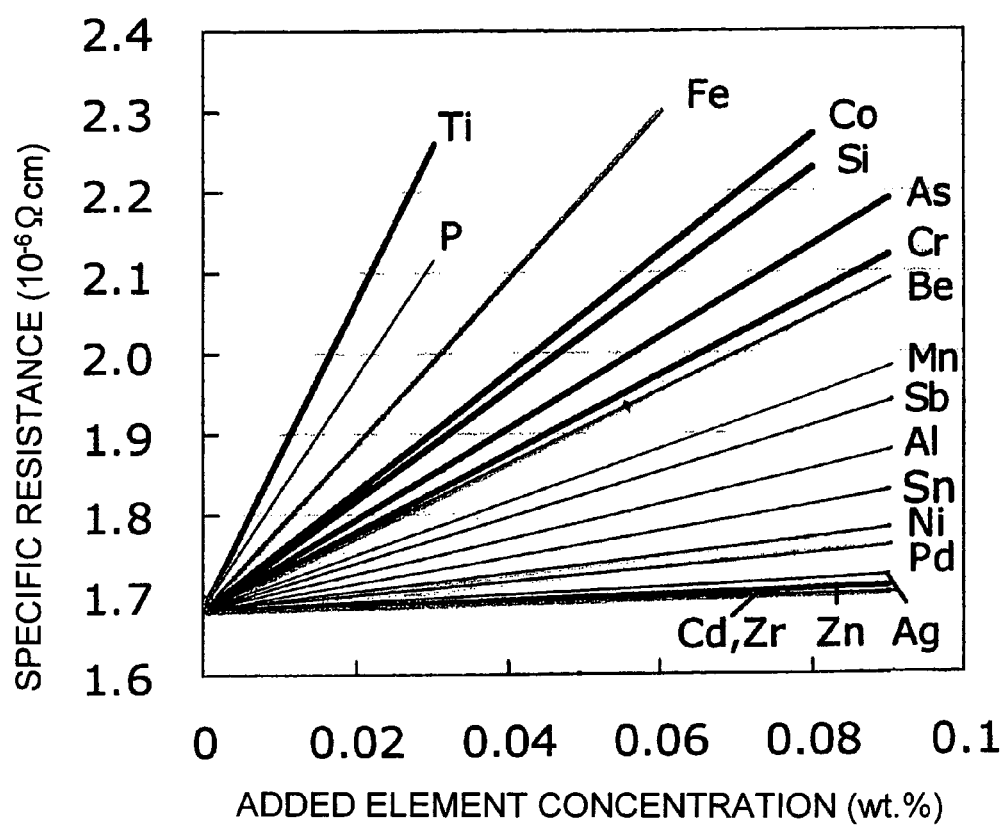
FIG. 4 is a graph showing a relation between an additive element concentration and a specific resistance of Cu alloy.

FIG. 4 shows a relation between a specific resistance and a concentration of each element added to Cu. The abscissa represents an added element concentration in the unit of "wt. %" and the ordinate represents a specific resistance in the unit of "$10^{-6}$ Ωcm".

It is also preferable to use an element having a large diffusion coefficient in order to uniformly diffuse the constituent element of the tight adhesive layer 31 into the conductive member 33 by annealing.

Figure 5:
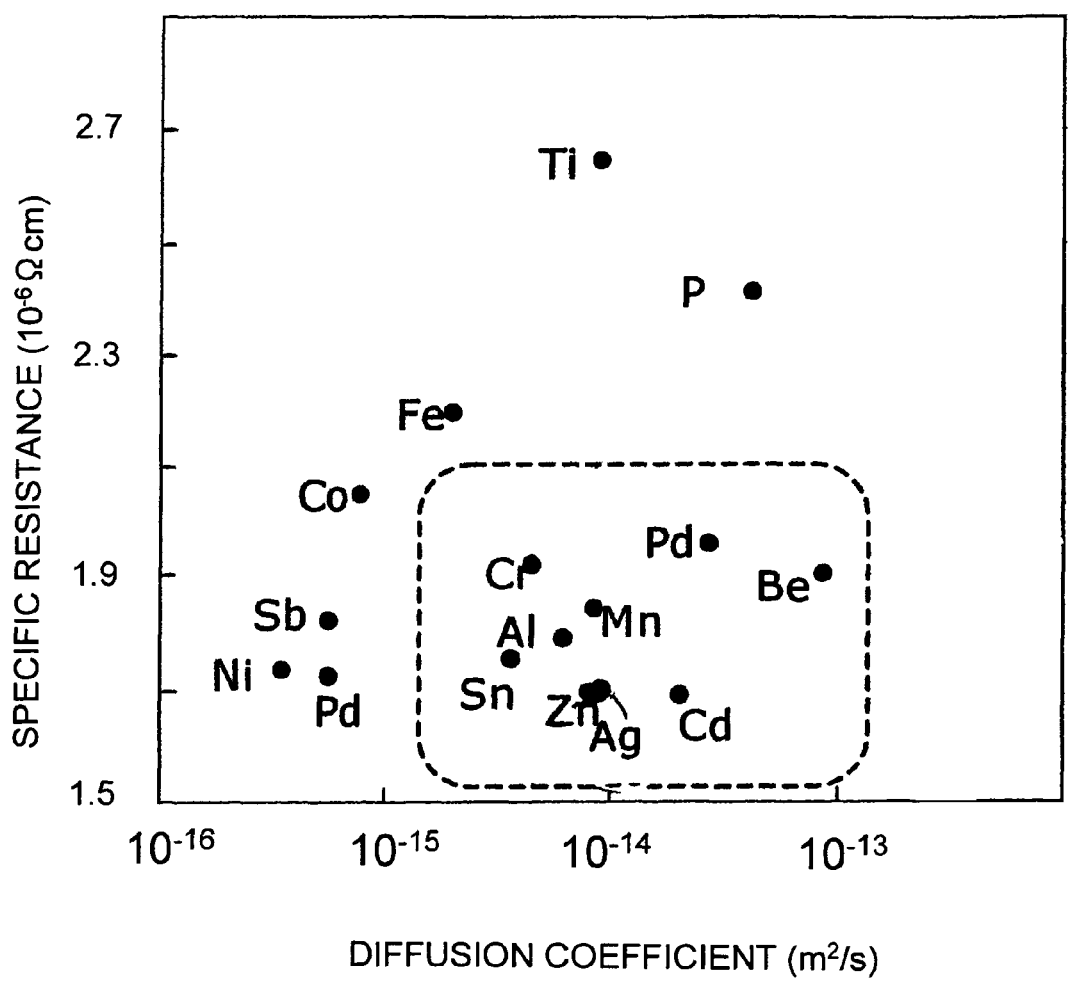
FIG. 5 is a graph showing a relation between a diffusion coefficient of each element in Cu and a specific resistance of Cu alloy.

FIG. 5 shows a relation between a diffusion coefficient and a specific resistance of each element at a temperature of 1000 K. The abscissa represents a diffusion coefficient in the unit of "$m^2/s$ and the ordinate represents a specific resistance of Cu alloy having a concentration of 0.05 wt. % in the unit of "$10^{-6}$ Ωcm". Candidates of element having a large diffusion coefficient and a small specific resistance are Ag, Zn, Cd, Sn, Al, Mn, Cr, Pd and Be. As described already, Mn segregates at the interface between the conductive member 33 and interlayer insulating film 23 so that it is not suitable for the material of the adhesion layer 31. Oxide of Be is poisonous to the human body so that its handling is inconvenient. Candidates of the material for the adhesion layer 31 are Zn, Cd, Sn, Al, Cr and Pd, in addition to Ag.

In the process shown in FIG. 2C, it is preferable that the adhesion layer 31 is deposited under the condition that the adhesion layer 31 deposited on the upper surface of the interlayer insulating film 23 is thicker than the adhesion layer 31 deposited on the inner surfaces of the wiring trench 25 and via hole 24. The following effects can be obtained by thickening the adhesion layer 31 deposited on the upper surface of the interlayer insulating film 23.

For example, when the adhesion layer 31 is formed by sputtering or the like, the adhesion layer 31 is deposited on the inner surfaces of the via hole 24 and wiring trench 25 thinner than that on the upper surface of the interlayer insulating film 23. If the adhesion layer 31 having a minimum necessary thickness is formed on the upper surface of the interlayer insulating film 23, necessary tight adhesion can be retained. If the adhesion layer 31 having a minimum thickness necessary for the flat surface is formed on the inner surfaces of the via wiring trench 25 and via hole 24, the wiring resistance increases. By thinning the adhesion layer 31 formed on the inner surfaces of the wiring trench 25 and via hole 24, it is possible to suppress an increase in wiring resistance while retaining necessary tight adhesion.

Next, a semiconductor device manufacture method according to the second embodiment will be described with reference to FIGS. 6A to 6C.

Figure 6A:
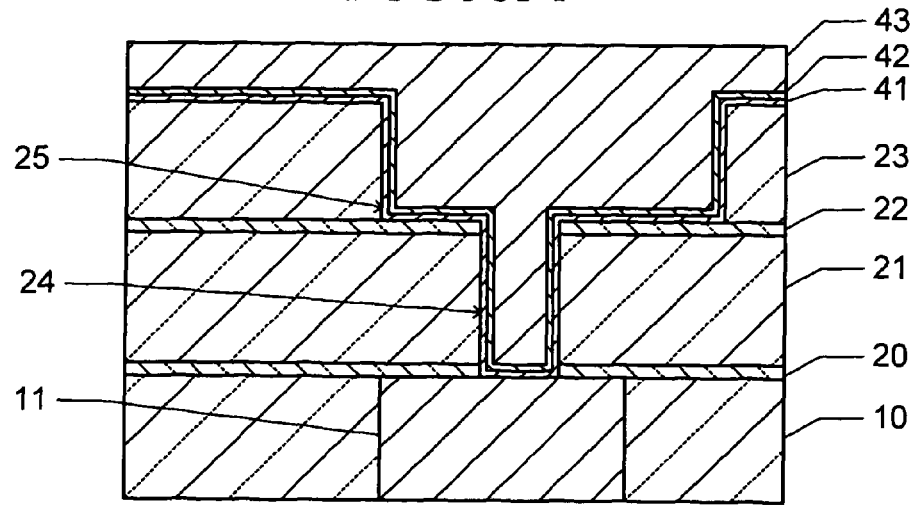
FIGS. 6A to 6C are cross sectional views of a semiconductor device during manufacture illustrating a semiconductor device manufacture method according to a second embodiment.

The processes of forming the wiring trench 25 and via hole 24 shown in FIG. 6A are the same as those of the first embodiment described with reference to FIGS. 2A and 2B. After the wiring trench 25 and via hole 24 are formed, the substrate is placed in a pre-processing chamber and the substrate surface is exposed to silane ($SiH_4$) plasma. A reformed film 41 added with Si is formed in an upper surface layer of the interlayer insulating film 23 and in inner surface layers of the wiring trench 25 and via hole 24. The reformed film 41 contains Si in higher concentration than a region remote from the surfaces of the interlayer insulating films 23 and 21.

An auxiliary film 42 of CuMn alloy is formed on the reformed film 41, and a conductive member 43 is formed by electroplating copper. The auxiliary film 42 and conductive film 43 are formed by the same method as that of forming the auxiliary film 32 and conductive member 33 of the first embodiment shown in FIGS. 2C and 2D. After the conductive member 43 is formed, annealing is performed for an annealing time of about 5 minutes at a temperature of 300 to 400° C. in an oxygen atmosphere.

Figure 6B:
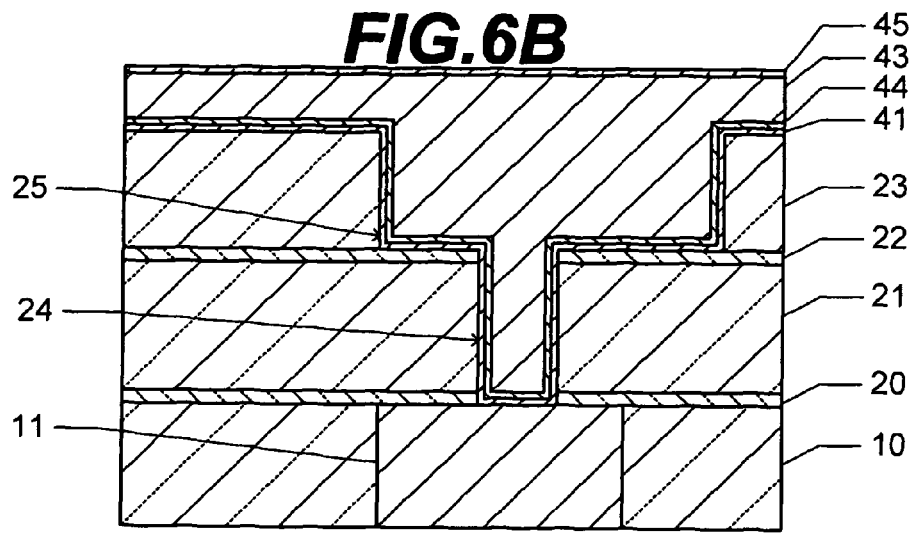

FIG. 6B shows the state after annealing. Si constituting the reformed layer 41 reacts with Mn constituting the auxiliary film 42 to form a barrier layer 44 of manganese silicide. Of Mn constituting the auxiliary film 42, Mn diffusing and reaching the surface of the conductive member 43 reacts with oxygen to form a manganese oxide film 45.

Figure 7A:
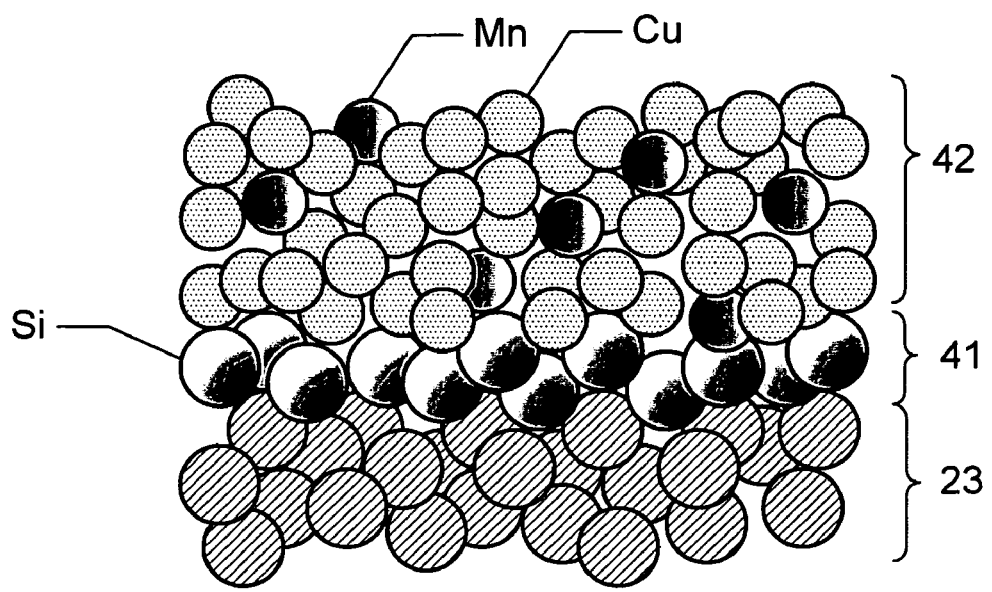
FIGS. 7A and 7B are conceptual diagrams of an interface between a conductive member and an interlayer insulating film at an atomic level, respectively before and after annealing in the semiconductor device manufacture method according to the second embodiment.
Figure 7B:
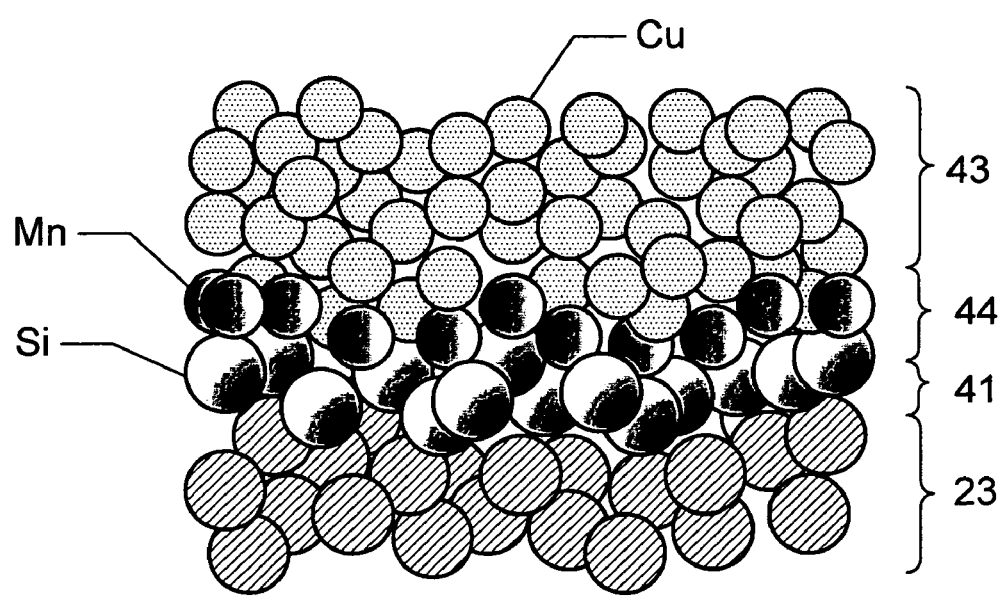

FIGS. 7A and 7B are conceptual diagrams showing an interface between the conductive member 43 and interlayer insulating film 23 at an atomic level before and after annealing, respectively. As shown in FIG. 7A, before annealing, it is possible to clearly distinguish the reformed film 41 having a high Si concentration and formed on the surface of the interlayer insulating film 23 from the auxiliary film 42 of CuMn alloy. As shown in FIG. 7B, after annealing, Mn is segregated on the surface of the reformed layer 41. This Mn binds to Si in the reformed layer 41 to form a barrier layer 44 made of manganese silicide ($Mn_2Si$, MnSi, etc.). If the reformed layer 41 is thin, it is difficult to distinguish the reformed layer 41 from the barrier layer 44 and both of the layers are mixedly integrated. Mn atoms constituting the barrier layer 44 not only bind to Si atoms constituting the reformed layer 41, but also may bind to Si atoms diffused from the interlayer insulating film 23 toward the auxiliary film 42.

As Mn in the auxiliary film 42 is segregated, the auxiliary film 42 extinguishes. Most of Mn diffused into the conductive member 43 are consumed by the manganese oxide film 45 formed on the conductive member 43. Mn constituting the barrier layer 44 will not diffuse again in the conductive member 43. It is therefore possible to obtain the conductive member 43 having a small Mn content and a high purity.

Figure 6C:
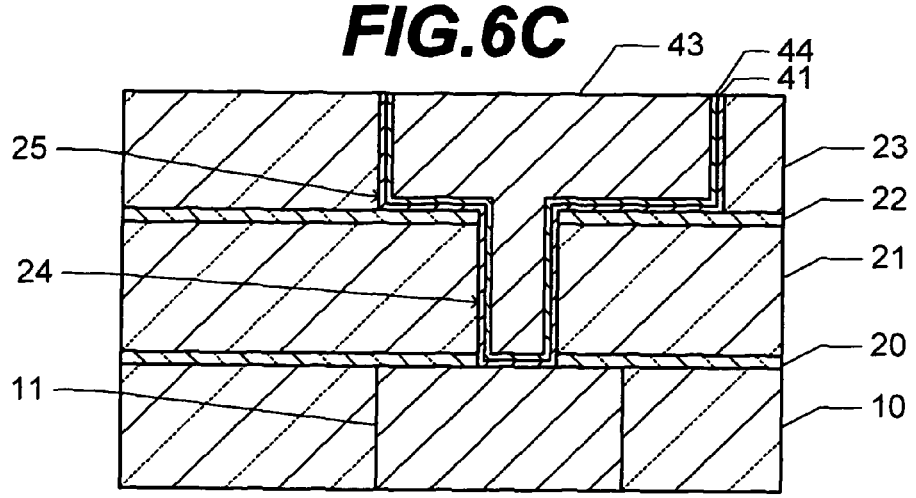

As shown in FIG. 6C, an unnecessary conductive member 43 is removed by CMP. The conductive member 43 left in the wiring trench 25 and via hole 24 constitutes the second layer wiring and functions also as an interlayer connection member between the first and second layer wirings.

In the second embodiment described above, the barrier layer 44 prevents copper diffusion and enhances tight adhesion of the conductive member 43. Until the barrier layer 44 is formed, the reformed layer 41 shown in FIG. 6A enhances tight adhesion of the auxiliary film 41 and conductive member 43. It is therefore possible to prevent peel-off of the conductive member 43.

Tight adhesion was evaluated by actually forming: 25 samples A having a CuMn alloy film of 90 nm in thickness formed on an $SiO_2$ film; 25 samples B having a CuMn alloy film of 90 nm in thickness formed on an SiOC film; 25 samples E having a CuMn alloy film of 90 nm in thickness formed after the surface of an $SiO_2$ film is exposed to $SiH_4$ plasma; and 25 samples F having a CuMn alloy film of 90 nm in thickness formed after the surface of an SiOC film is exposed to $SiH_4$ plasma. Tight adhesion was evaluated by JIS crosscut tape tests ASTM3359-87. In all 25 samples A and all 25 samples B, peel-off arose, whereas in the samples E and F, peel-off did not arise. It can be understood from these evaluation results that the reformed layer 41 has the function of enhancing tight adhesion of the auxiliary film 42. It can be considered that Si constituting the reformed layer 41 binds to Cu constituting the auxiliary film 42 to enhance tight adhesion between the reformed layer 41 and auxiliary film 42.

In the second embodiment, although the reformed layer 41 containing Si in high concentration is formed, the reformed layer 41 may contain an element other than Si in high concentration which can enhance adhesion to Cu and react with Mn and form the barrier layer preventing Cu diffusion. Such elements may be S, N, P, C, O, B and the like. These elements react with Mn to form manganese sulfide (MnS), manganese nitride ($Mn_3N_2$), manganese phosphide ($Mn_3P_2$, MnP), manganese carbide ($Mn_3C$, $Mn_7C_3$, etc.), manganese oxide ($MnO_2$), manganese boride (MnB), and the like. Plasma gas used for forming the reformed film may be $SO_x$, $SF_6$, $N_2$, $PH_3$, $CH_4$, $CO_2$, $O_2$, $B_2H_6$, $Si_2H_6$ and the like.

In the second embodiment described above, although the reformed layer 41 is formed by exposing the substrate surface to various plasma, the reformed layer may be formed by other methods. For example, an ion beam containing ions of S, N, P, C, Si, O or B is used to implant ions in the surface layer of the interlayer insulating film and form the reformed layer. The substrate may be heated in a temperature range of 50 to 500° C. in silane gas.

Instead of relatively raising the concentration of S, N, P, C or B in the surface layer of the interlayer insulating film, one of these elements may be doped at a high concentration into the interlayer insulating film. A concentration of these elements is preferably set to $1 \times 10^{20}$ atoms/cm$^3$.

Next, description will be made on a semiconductor device manufacture method according to the third embodiment. In the second embodiment, prior to depositing the auxiliary film 42 of CuMn alloy shown in FIG. 6A, the exposed surface is reformed. In the third embodiment, instead of reforming the surface layer, an adhesion layer is formed which contains the same element as that of the reformed layer 41 of the second embodiment. For example, the adhesion layer is made of S, P, C, Si or B.

These films may be formed by CVD. Source gas of CVD may be borazine ($B_3NH_6$), hydrogen carbide gas ($CH_4$, $C_2H_6$, etc.), silane ($SiH_4$), disilane ($Si_2H_6$), sulfur hexafluoride ($SF_6$), phosphine ($PH_3$) and the like.

It is preferable that the adhesion layer is deposited under the condition that the adhesion layer deposited on the upper surface of the interlayer insulating film becomes thicker than the adhesion layer deposited on the inner surfaces of the wiring trench and via hole. By thinning the adhesion layer in the wiring trench and via hole, the barrier layer 44 can be formed uniformly.

In the above-described embodiments, although the auxiliary film 32 shown in FIG. 2C and the auxiliary film 42 shown in FIG. 6A are made of CuMn alloy, the auxiliary film may be made of Cu alloy containing Al, Mg, Ni or Re, other than Mn. These metal elements can easily form oxide and form a thin and uniform quality oxide layer at the interface between the conductive member and interlayer insulating film. These metal elements are likely to segregate on the surface of Cu alloy and at the interface with the interlayer insulating film, rather than forming a solid solution in Cu. It is therefore possible to suppress a rise in wiring resistance.

The present invention has been described in connection with the preferred embodiments. The invention is not limited only to the above embodiments. It will be apparent to those skilled in the art that other various modifications, improvements, combinations, and the like can be made.

What we claim are:

1. A semiconductor device manufacture method comprising steps of:
   (a) forming an interlayer insulating film having a concave portion, on a semiconductor substrate;
   (b) forming an adhesion layer on an inner surface of the concave portion and on an upper surface of the interlayer insulating film;
   (c) covering a surface of the adhesion layer with an auxiliary film made of Cu alloy containing a first metal element;
   (d) embedding a conductive member containing a second metal element other than the first metal element, in the concave portion, and depositing the conductive member on the auxiliary film; and
   (e) performing heat treatment to make atoms of the first metal element in the auxiliary film segregate on the inner surface of the concave portion and atoms of the adhesion layer diffuse into the conductive member,
   wherein the adhesion layer contains an element for enhancing tight adhesion of the auxiliary film more than if the auxiliary film is deposited directly on a surface of the interlayer insulating film; and
   wherein a third metal element constituting the adhesion layer diffuses in the conductive member, and the adhesion layer is extinguished during the heat treatment.

2. The semiconductor device manufacture method according to claim 1, wherein:
   the step (b) deposits the adhesion layer containing the third metal element having at least one metal element selected from a group consisting of Ag, Zn, Cd, Sn, Al, Cr and Pd, on the inner surface of the concave portion and the upper surface of the interlayer insulating film.

3. The semiconductor device manufacture method according to claim 2, wherein the step (b) deposits the auxiliary film under a condition that a portion deposited on the upper surface of the interlayer insulating film is thicker than a portion covering the inner surface of the concave portion.

4. The semiconductor device manufacture method according to claim 1, wherein the first metal element is Mn, Al, Mg, Ni or Re.

5. The semiconductor device manufacture method according to claim 1, wherein, after the performing heat treatment a concentration of the third metal element in the conductive member is about 0.05 wt %.

* * * * *